United States Patent [19]

Katsuura et al.

[11] Patent Number: 5,593,046
[45] Date of Patent: Jan. 14, 1997

[54] COLLAPSIBLE HOUSING FRAME

[75] Inventors: Nobuo Katsuura; Takashi Dei, both of Kanagawa, Japan

[73] Assignee: Nikko Kogyo Kabushiki Kaisha, Kanagawa, Japan

[21] Appl. No.: 315,356

[22] Filed: Sep. 30, 1994

[30] Foreign Application Priority Data

May 9, 1994 [JP] Japan ................................. 6-117453

[51] Int. Cl.⁶ ..................................................... H05K 5/00
[52] U.S. Cl. .............................. 211/41; 211/201; 211/175; 211/26; 211/162; 312/265.3; 312/258; 312/223.2; 312/350; 361/801; 361/802; 361/759
[58] Field of Search ..................................... 211/195, 201, 211/26, 175, 41, 162; 361/796, 801, 802, 798, 755, 759; 312/223.2, 265.2, 265.3, 264, 258, 108, 350

[56] References Cited

U.S. PATENT DOCUMENTS

| 613,323 | 11/1898 | Scott ................................... 211/175 X |
| 1,015,926 | 1/1912 | Anderson ........................... 211/201 X |
| 1,407,607 | 2/1922 | Wakeham ................................ 211/201 |
| 2,440,513 | 4/1948 | Kaelin et al. ........................... 211/201 |
| 3,061,396 | 10/1962 | Hock ....................................... 312/258 |
| 4,523,768 | 6/1985 | Dwbala .................................. 211/195 |
| 4,761,044 | 8/1988 | Akama et al. ........................... 312/110 |

FOREIGN PATENT DOCUMENTS

| 440003 | 8/1991 | European Pat. Off. ............... 211/195 |
| 58-9861 | 2/1983 | Japan . |
| 61-34297 | 10/1986 | Japan . |
| 2-45687 | 3/1990 | Japan . |
| 3-56507 | 12/1991 | Japan . |
| 3-56508 | 12/1991 | Japan . |
| 6-7290 | 1/1994 | Japan . |
| 6-6075 | 2/1994 | Japan . |
| 6-125185 | 5/1994 | Japan . |
| 699767 | 11/1953 | United Kingdom ................... 211/201 |

OTHER PUBLICATIONS

Official Gazette of Utility Models 58–9861, 61–34297, 2–45687, 3–56508, 6–6075, 6–7290, 6–125185.

*Primary Examiner*—Alvin C. Chin-Shue
*Assistant Examiner*—Brian J. Hamilla
*Attorney, Agent, or Firm*—Fish & Richardson P.C.

[57] ABSTRACT

The collapsible housing frame has a pair of side frame boards opposed to each other, and connecting mechanisms which connect both the opposed ends of the side frame boards. Both ends of the side frame boards are connected to the connecting mechanisms through first hinges. Each of the connecting mechanisms is formed to be collapsible at a second hinge of the connecting mechanism, and a lock-unlock system to lock and unlock the hinge is provided at the second hinge.

4 Claims, 7 Drawing Sheets

COLLAPSIBLE HOUSING FRAME

BACKGROUND OF INVENTION

1. Field of the Invention

The present invention relates to a collapsible housing frame. More specifically, the present invention relates to a collapsible housing frame in which printed circuit boards to be incorporated into various kinds of electric and electronic equipment, as well as panel plates for use in other industrial fields (such as panels used as construction materials) are 1temporarily placed for transportation and storage purposes.

2. Description of the Prior Art

Housing frames have been used as containers for transportation and storage purposes, which receive printed circuit boards to be incorporated into various kinds of electric and electronic equipment, as well as panel plates for use in other industrial fields. As an example, a housing frame comprises an outer frame which is formed by securing a top plate and a bottom plate, which are placed with a uniform space between them, with four support columns at their four corners. Either the right or left side of the outer frame is composed of a fixed side frame board which is erected by being secured at the support columns, and the other side of the outer frame is composed of a movable side frame board which is erected opposite to the fixed side frame board, and which is movable in parallel to the fixed side frame board and can be secured at a desirable position. In this housing frame, a plurality of parallel supporting grooves which correspond to each other are formed on the opposite faces (inner faces) of the fixed side frame board and the movable side frame board. The housing frame is designed to be capable of mounting and placing desired printed circuit boards and other panel plates on multiple layers by placing them across pairs of the supporting grooves opposite to each other and located at horizontal positions, perpendicular to said inner faces.

Another example of the prior art is disclosed in an official gazette of the Japanese Utility Model Laid-Open (Kokai) Publication No. HEI 2-45687. A housing frame disclosed in this official gazette has a construction in which: two sheets of erect side frame boards are provided, facing each other, between a top plate and a bottom plate which are mounted with a uniform distance between them; one of the side frame boards a fixed side frame board, and the other side frame board is a movable side frame board which is movable in parallel to the fixed side frame board and which can be secured at a desirable position; at least one pinion is mounted in a rotatable manner at each of four positions close to four corners of the movable side frame board, which pinions interlock with each other, and; guide rails with racks which engage with all the pinions are mounted on the inner faces of the top plate and the bottom plate in a direction perpendicular to the fixed side frame board.

However, the conventional housing frames described above keep the same shape as they contain printed circuit boards and panel plates, even when they do not actually contain these materials. Therefore, carrying an empty housing frame is like carrying air, and is a waste of space, which is very problematic. Another problem is that a large space needs to be procured in order to store the empty housing frames.

The present invention aims to solve the above-described problems related to conventional housing frames and to provide a collapsible housing frame which can be transported or stored utilizing the smallest space necessary.

SUMMARY OF THE INVENTION

In order to achieve the above-described objectives, the present invention provides a collapsible housing frame which has a pair of frame boards opposed to each other, and connecting members to connect the opposing ends of these frame boards. This collapsible housing frame is characterized by the following points: the ends of the frame boards are connected to the connecting members through first hinges; each of the connecting members is made to be collapsible at a hinge intermediating in the central portion of the connecting member; and a lock-unlock system to lock and unlock the hinge is provided on the second hinge.

The lock-unlock system can be located on the second hinge at a position closer to the collapsing direction than the rotation axis of the second hinge.

The connecting members may be made collapsible either inwardly or outwardly at the second hinge.

The present invention provides a collapsible housing frame with connecting members, the length of which in the direction perpendicular to the side frame boards can be made adjustable.

According to the present invention, when unlocking the lock-unlock system from the locked state, each of the connecting mechanisms can be collapsed at a second hinge which acts as a fulcrum by the function (as a fixed fulcrum point of rotation movement) of the first hinges which connect the frame boards and the connecting member, and of the second hinge. Accordingly, the size of the collapsible housing frame can be made smaller and the collapsible housing frame can be transported and stored in the smallest space necessary.

Moreover, the lock-unlock system is provided on the second hinge at a position closer to the collapsing direction than the rotation axis of the second hinge, and therefore, the lock-unlock system is not a hindrance in folding up the connecting mechanisms. Accordingly, it becomes possible to fold up the housing frame in a more compact manner.

Each of the connecting mechanisms may be folded either inwardly or outwardly at the second hinge. If it is folded inwardly, the housing frame can be folded up to be a smaller size with the width substantially equal to that of the frame boards. If it is folded outwardly, the housing frame can be folded up to become even thinner. Moreover, if it is folded inwardly, the lock-unlock system can be provided on the second hinge at a position closer to the inside of the housing frame than the rotation axis of the second hinge, thereby greatly lessening the risk of unlocking the lock by mistake due to some obstacle contacting the lock-unlock system.

Further, the housing frame of this invention is capable of corresponding to different sizes of printed circuit boards and panel plates to be contained by making the length of the connecting members in the direction perpendicular to the frame boards adjustable, thereby enhancing the usability of the housing frame.

DETAILED DESCRIPTION OF THE PREFERRED EMBODIMENTS

An example of the present invention is explained hereinafter with reference to drawings.

Figure 1:
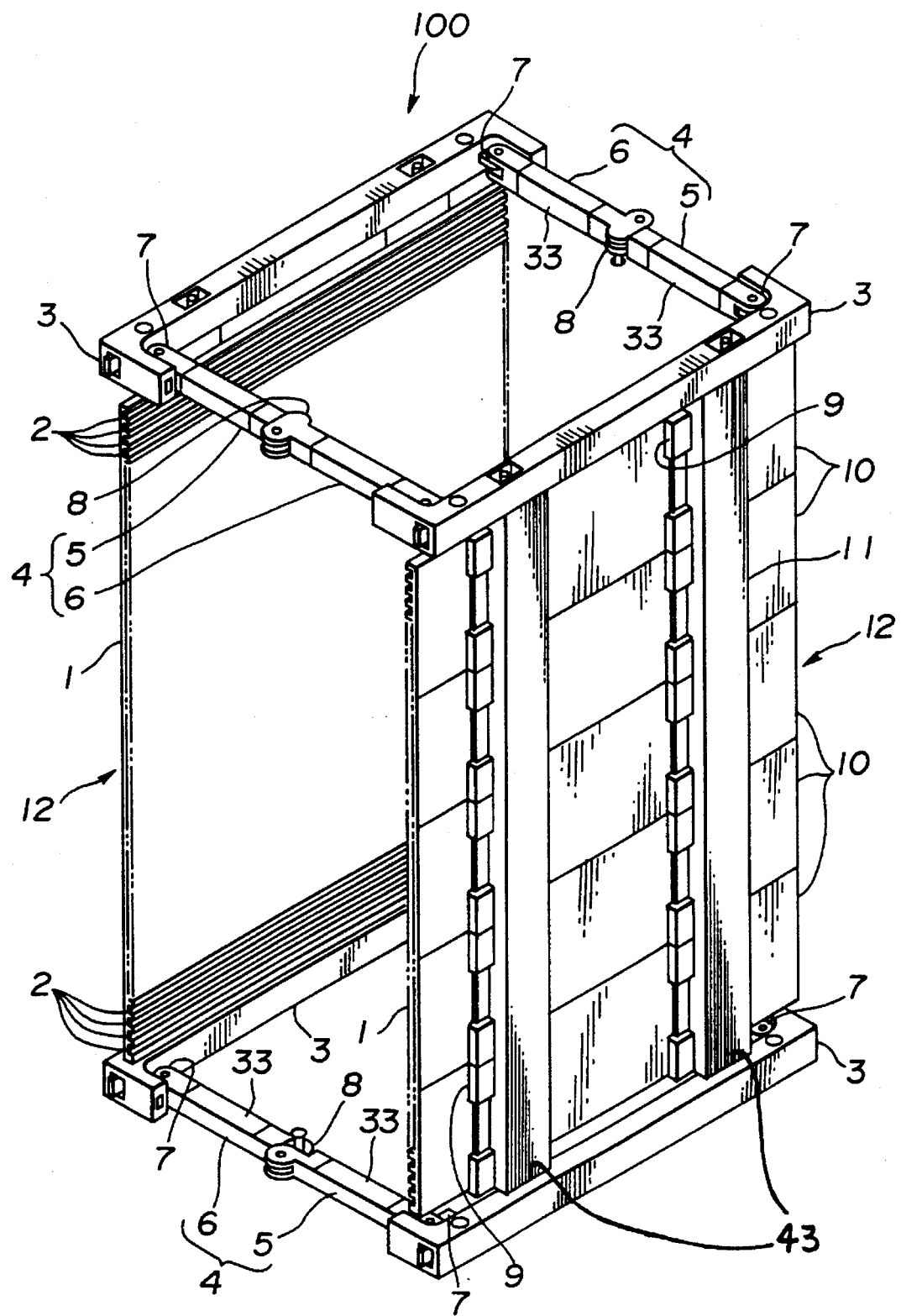
FIG. 1 is a perspective view of the collapsible housing frame of the present invention.
Figure 2:
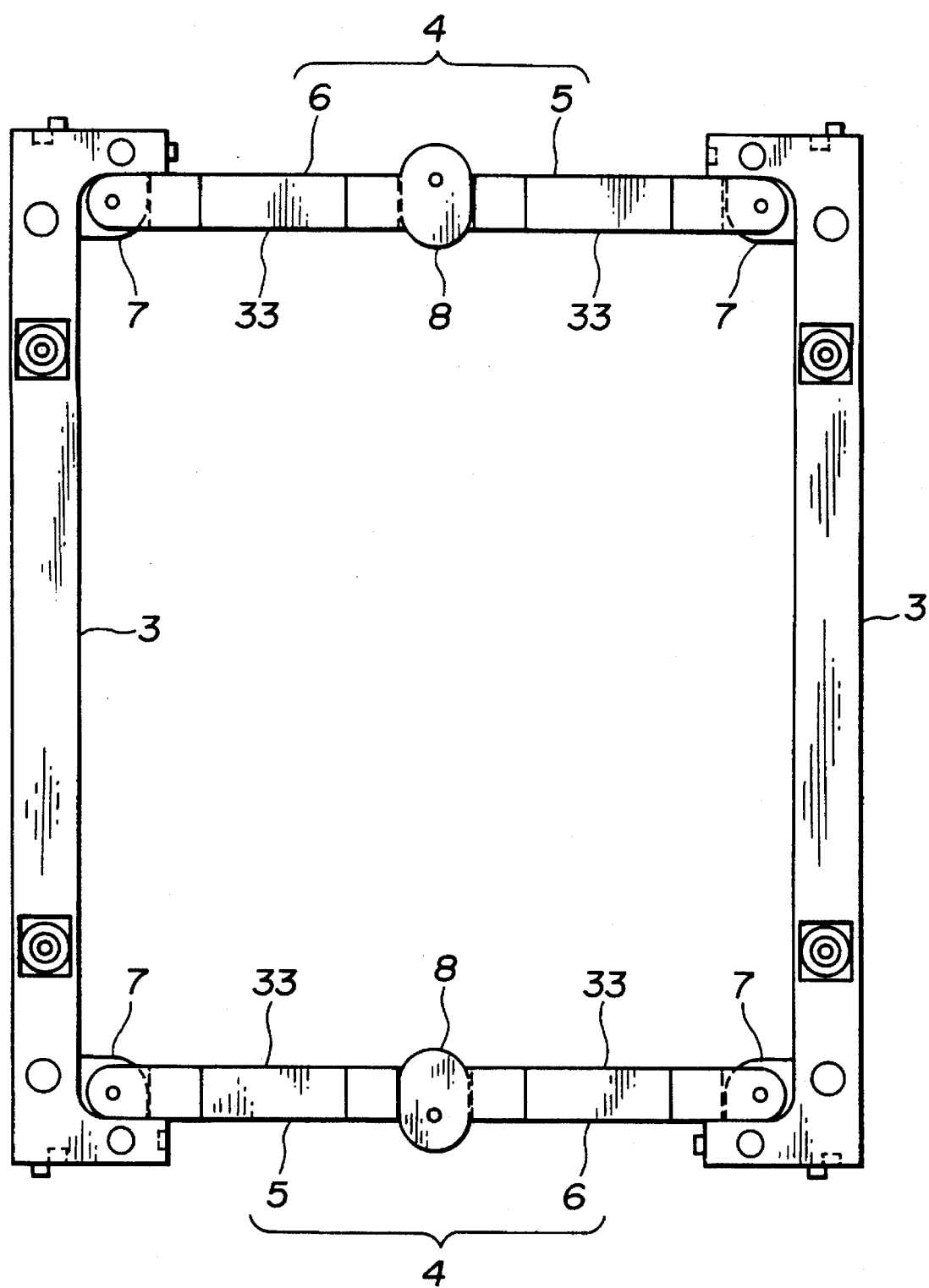
FIG. 2 is a plan view of the collapsible housing frame shown in FIG. 1.
Figure 3:
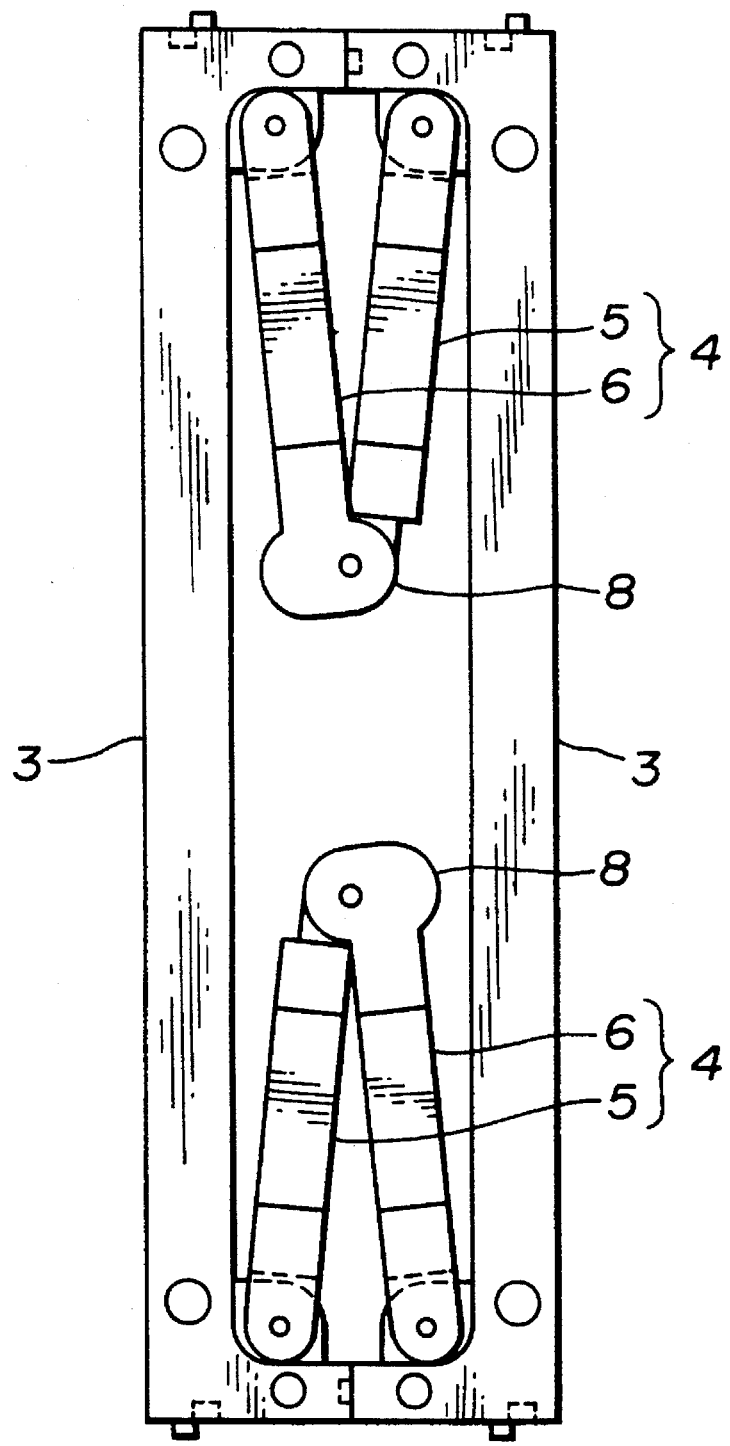
FIG. 3 is a plan view of the collapsible housing frame shown in FIG. 1 in a collapsed state.
Figure 4:
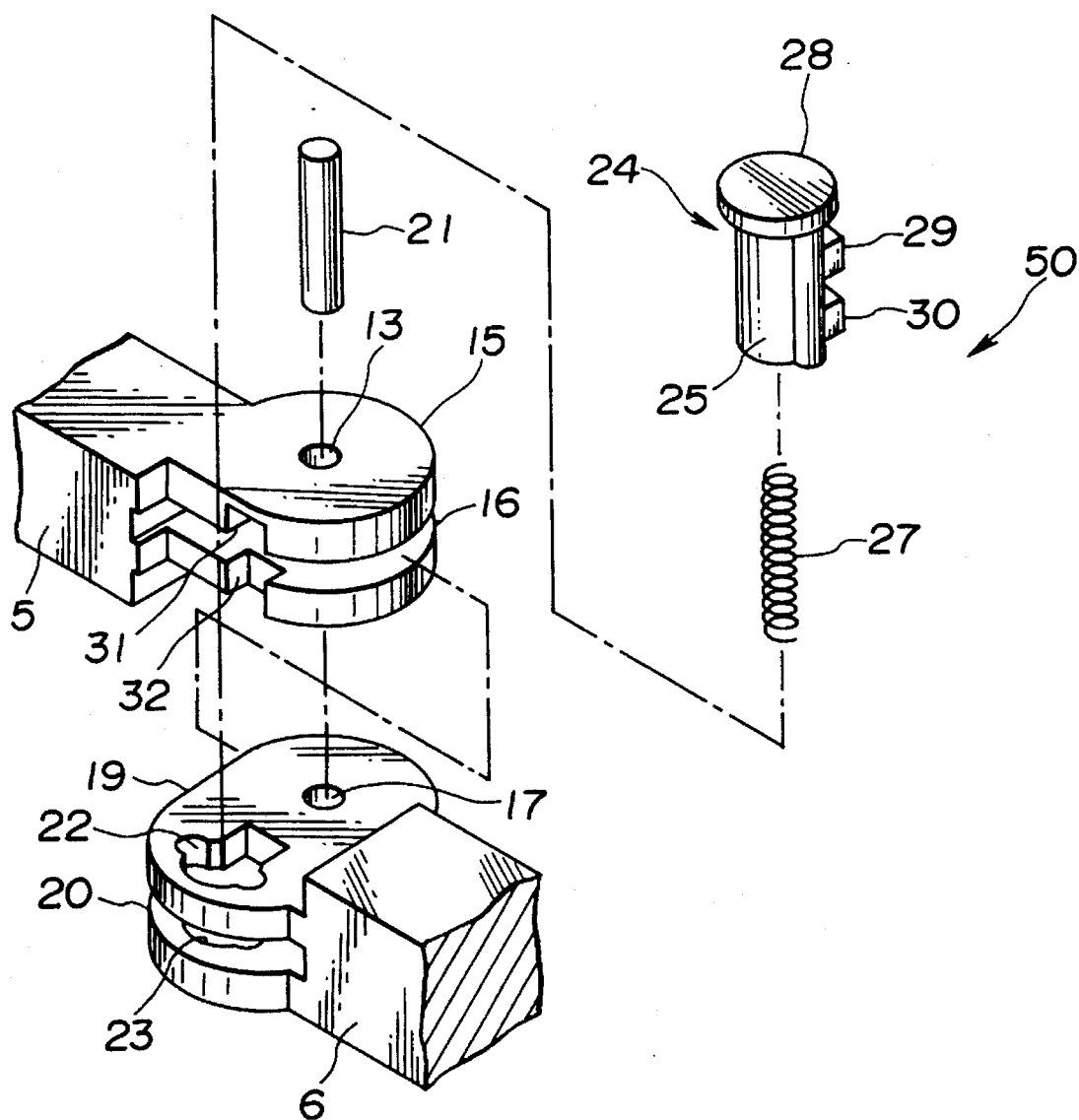
FIG. 4 is an enlarged perspective view of a part of the collapsible housing frame shown in FIG. 1.
Figure 5:
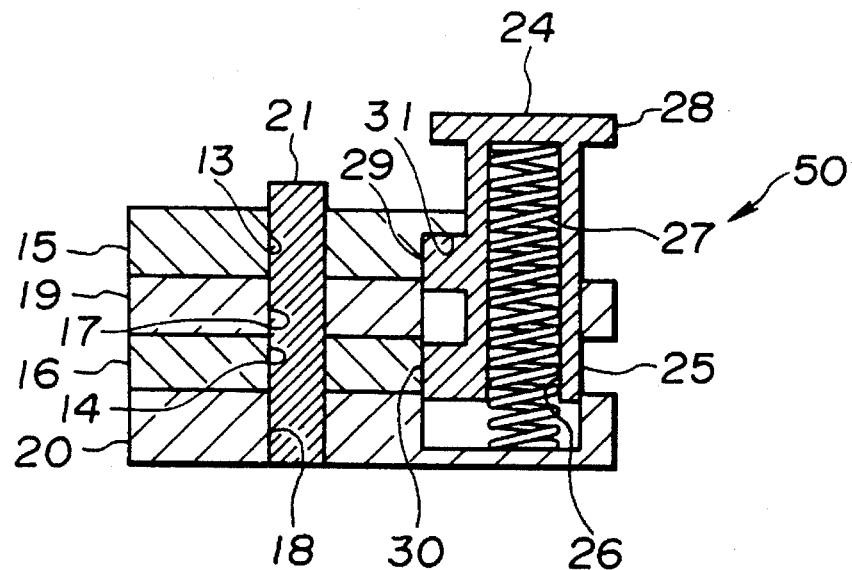
FIG. 5 is a sectional view of the lock-unlock system of the collapsible housing frame shown in FIG. 1.
Figure 6:
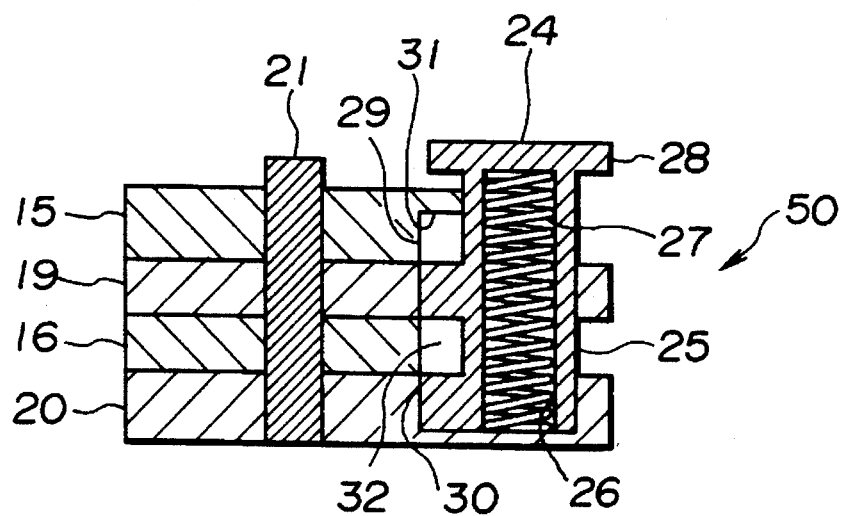
FIG. 6 is a sectional view of the lock-unlock system of the collapsible housing frame shown in FIG. 1.
Figure 7:
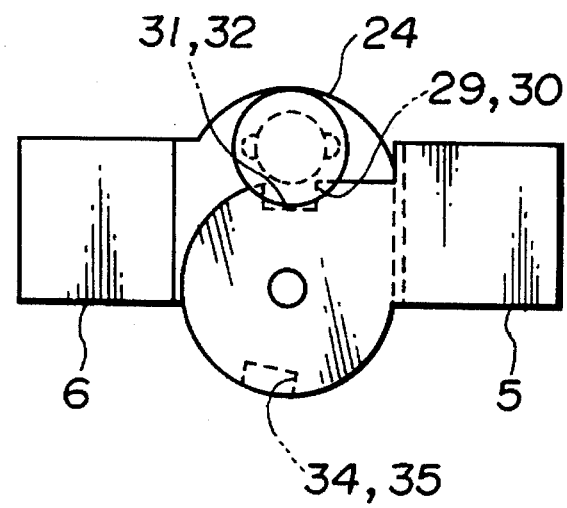
FIG. 7 is a plan view of the lock-unlock system of the collapsible housing frame shown in FIG. 1.
Figure 8:
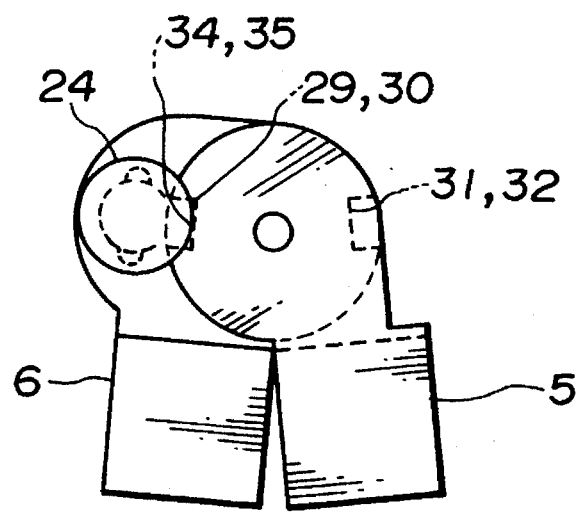
FIG. 8 is a plan view of the lock-unlock system of the collapsible housing frame shown in FIG. 1.

FIG. 1 is a perspective view of the collapsible housing frame of the present invention. FIG. 2 is a plan view of the collapsible housing frame shown in FIG. 1. FIG. 3 is a plan view of the collapsible housing frame shown in FIG. 1 in a collapsed state. FIG. 4 is an enlarged perspective view of a part of the collapsible housing frame shown in FIG. 1. FIGS. 5 and 6 are sectional views of the lock-unlock system of the collapsible housing frame shown in FIG. 1. FIG. 5 shows a locked state and FIG. 6 shows an unlocked state. FIGS. 7 and 8 are plan views of the lock-unlock system.

As shown in FIGS. 1 and 2, a collapsible housing frame (100) of the present invention is formed in a box shape which has two side frame boards (1, 1) opposed to each other, bases (3, 3, 3, 3) mounted at the tops and bottoms of the side frame boards (1, 1), and connecting mechanisms (4, 4, 4, 4) which connect both opposed ends of the bases (3, 3, 3, 3).

Side frame boards (1, 1) are composed of: a plurality of unit plates (10) which have a plurality of parallel grooves (2) on opposite faces (inner surfaces) of the unit plates (10) in a manner such that the grooves (2) on the opposed unit plates (10) correspond to each other; and hook-shaped pieces (9, 9, 9, 9) mounted on the top and bottom of the outer surface of each unit plate (10) at positions closer to the center of the unit plate away from both ends of the lengthwise direction. In other words, the side frame board (1) has a construction in which a plurality of the unit plates (10) are combined with each other, one plate being placed on top of another, to form a flat plane, and tongues of hat steel (11) are secured by a pair of hook-shaped pieces (9, 9), thereby uniting the plural unit plates (10) in a skewered manner. The ends of the hat steel (11) of the united side frame board (1) are inserted into grooves (43) on the bases (3) and screwed to the bases (3), thereby securing the side frame board (1) at the top and bottom bases (3) to form a frame board (12).

The connecting mechanism (4) has: rectangular legs (5, 6) located on its right and left sides; a central hinge (8) which is a second hinge and which connects the legs (5) and (6) in a freely rotatable manner; and corner hinges (7) which are first hinges and which connect the legs (5) and (6) to the side frame boards (1). The leg (5) is connected to one of the side frame boards (1) through a first hinge (7) in a freely rotatable manner. The leg (6) is connected to the other side frame board (1) through a first hinge (7) in a freely rotatable manner. In this example, as shown in FIG. 3, the first hinges (7) and the second hinge (8) are mounted so that the legs (5) and (6) are folded inwardly at the second hinge (8) as a fulcrum.

The legs (5) and (6) are composed of square pipes (33) held between the hinges, so that the distance between the side frame boards (1, 1), i.e., the lengthwise length of the connecting mechanism (4), can be adjusted by changing the length of the square pipes (33). Therefore, the present invention is capable of corresponding to changes in size of circuit boards to be placed in the collapsible housing frame (100).

As shown in FIGS. 4 through 6, the second hinge (8) has and is composed of: essentially circular parallel plates (15, 16) which are mounted at the end of the leg (5) and protrudes toward the lengthwise direction, and on which centering holes (13, 14) are formed as bearings for the rotation pin (21) of the second hinge (8); substantially oval parallel plates (19, 20) which are longer in the direction perpendicular to the lengthwise direction, which are mounted at the end of the leg (6) and protrude toward the lengthwise direction, and on which centering holes (17, 18) are formed to correspond to the centering holes (13, 14); and a rotation pin (21) which is inserted into the centering holes (13, 14, 17, 18) when the parallel plates (15, 16, 19, 20) are placed over one another.

An engaging groove (31), which engages with a rib (29) of a cylindrical portion (25) of a lock-unlock system which is the lock-unlock system of the present invention, is formed on the inside of the parallel plate (15) as explained later. A nick (32), which engages with a rib (30) of a cylindrical portion (25), is formed on the inside of the parallel plate (16). A mounting hole (22) is formed on the parallel plate (19), and a mounting hole (23) on the parallel plate (20), at a portion of the parallel plates (19) or (20) protruding inwardly away from the parallel plates (15) and (16) when the parallel plates (15, 16, 19, 20) are placed over one another. The mounting hole (22) is a piercing hole which corresponds with the mounting hole (23). The mounting hole (23) is open on the side facing the mounting hole (22) and is closed on the opposite side.

A lock-unlock system (50) to lock and unlock the hinge (8) is mounted on the second hinge (8). The lock-unlock system (50) has and is composed of: a lock pin (24) which is composed of a cylindrical portion (25) corresponding to the shape of the mounting holes (22, 23) of the parallel plates (19, 20), and of a flange (28) which is mounted at one end of the cylindrical portion (25); and a compression spring (27) to be inserted into a hollow space (26) formed inside of the cylindrical portion (25).

Rectangular ribs (29, 30) are mounted on the outer periphery of the cylindrical portion (25) in a manner projecting in the direction perpendicular to the lengthwise direction and in parallel to each other with some space between them. The rib (29) is formed in a shape which enables engagement with the engaging groove (31), and the rib (30) is formed in a shape which enables the engagement with the nick (32).

The lock-unlock system (50) is mounted on the second hinge (8) at a position closer to the collapsing direction than the rotation axis of the second hinge (8) (in other words, closer to the inside of the collapsible housing frame (100)). This positioning of the lock-unlock system (50) has the advantage of lessening the risk of unlocking the lock by mistake due to contact with some obstacle. Moreover, since the lock-unlock system (50) is not a hindrance in folding up the housing frame, it is possible to fold up the collapsible housing frame (100) compactly.

In order to assemble the lock-unlock system (50), as shown in FIG. 4, the lock pin (24) with the compression spring (27) inserted into the hollow space (26) is inserted into the mounting hole (22), the parallel plates (15, 16, 19, 20) are to be placed over one another in a manner such that the ribs (29, 30) may engage with the engaging groove (31) and the nick (32), the rotation axis (21) is to be inserted into the centering holes (13, 14, 17, 18), and the rotation axis (21) should either be press fitted or be secured with E rings or other members at both ends so that it will not come off.

Examples of the usage of the collapsible housing frame of the present invention are explained hereinafter.

When the housing frame is expanded in order to receive circuit boards and other panel plates, as shown in FIG. 5, the rib (29) of the cylindrical portion (25) engages with the engaging groove (31) of the parallel plate (15), the rib (30) engages with the nick (32) of the parallel plate (16), and the rib (29) is caught in the engaging groove (31) by the repulsive power of the compression spring (27). Accordingly, the second hinge (8) enters into a locked state, the legs (5) and (6) are secured in a straight line, and the collapsible housing frame (100) is in the state shown in FIGS. 1 and 2.

When an empty collapsible housing frame (100) is folded up, as shown in FIG. 6, the lock pin (24) is pushed down against the repulsive power of the compression spring (27), and the cylindrical portion (25) is moved toward the direction of shrinkage of the compression spring (27), thereby releasing the ribs (29) and (30) from the engaging groove (31) and the nick (32). Then, by folding the second hinge (8) inwardly, the ribs (29) and (30), while being retained in the mounting holes (22, 23) of the parallel plates (19, 20), rotate together with the parallel plates (19) and (20), thereby enter an unlocked state.

Next, by rotating the legs (5) and (6) inwardly at the second hinge (8) which acts as a fulcrum, the connecting mechanism (4) is folded toward the inside of the collapsible housing frame (100), as shown in FIG. 3. Accordingly, it is possible to store and put the housing frame in a small space.

Figure 9:
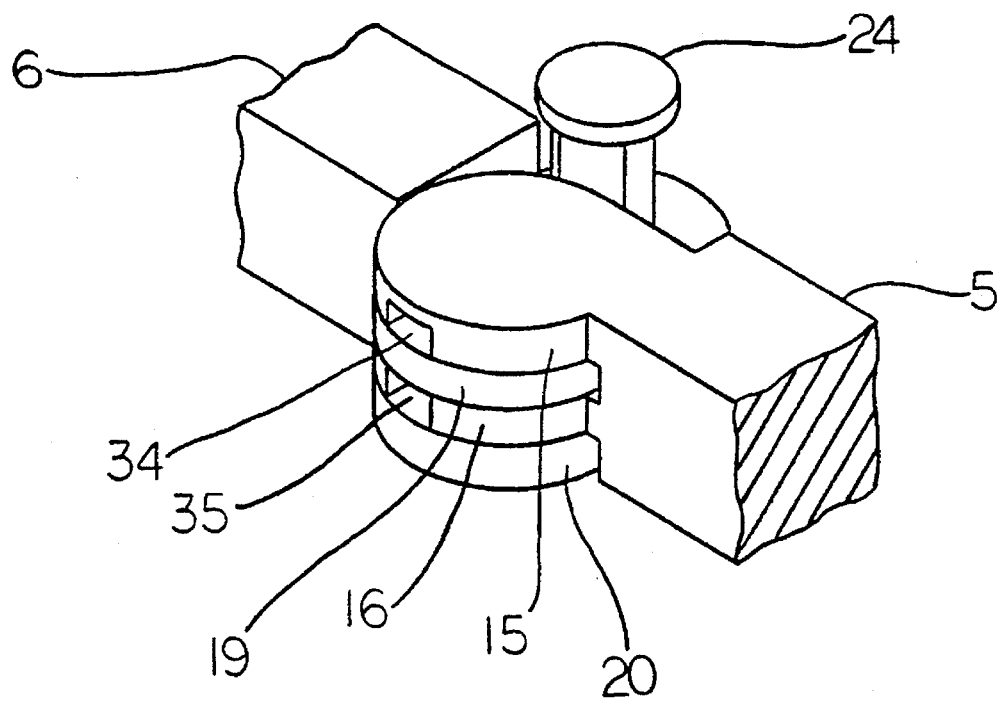
FIG. 9 is a perspective view of the lock-unlock system of the collapsible housing frame shown in FIG. 1.

As shown in FIGS. 7 and 9 in order to lock the second hinge (8) in the collapsed state, an engaging groove (34) having a shape similar to that of the engaging groove (31) is to be provided on the parallel plate (15) at a position corresponding to the rib (29) in the collapsed state, and a nick (35) having a shaped similar to that of the nick (32) is to be provided on the parallel plate (16) at a position corresponding to the rib (30) in the collapsed state. Then, as shown in FIGS. 8 and 9 the rib (29) should be caught in the engaging groove (34), and the rib (30) should be caught in the nick (35).

In order to place circuit boards and other panel plates in the collapsible housing frame (100) again, if the second hinge (8) is locked, the lock should be released. After the legs (5) and (6) are caused to rotate outwardly at the second hinge (8), acting as a fulcrum, to form a straight line, the lock-unlock system (50) should be put into a locked state by following the aforementioned process in reverse order.

Since the lock-unlock system of the collapsible housing frame (100) of the present invention can be easily locked and unlocked with one touch, it has the advantages that it is easy to fold up and the folding-up process can be automated.

Materials of the collapsible housing frame (100) of the present invention are not specifically limited as long as its functions are maintained. Therefore, if its main components are made of a material such as synthetic resin which has moderate elasticity and hardness, the weight of the collapsible housing frame may be reduced. As an example, the side frame boards (1) and the bases (3) may be formed from polystyrene, and the legs (5) and (6) may be formed from polyacetate.

Although the connecting mechanisms (4) are folded inwardly in the above-described example, the folding direction is not limited and the connecting mechanisms (4) may be folded outwardly.

Although the lock-unlock system (50) is mounted on the second hinge (8) at a position closer to the inside of the housing frame than the rotation pin (21) of the second hinge (8) in the above-described example, the position of the lock-unlock system (50) is not limited, and the lock-unlock system (50) may be mounted at any desirable position, for example, at a position outside of the rotation axis (21).

Moreover, in the above-described example, square pipes (33) are held between the legs (5) and (6), and the length of the connecting mechanisms (4) is adjusted by providing the legs with interchangeable square pipes (33) of different lengths so that the housing frame may correspond to changes in size of the circuit boards and other panel plates to be placed inside.

As explained above, in the collapsible housing frame of the present invention, each of the connecting mechanisms which connect the opposed frame boards is formed in a collapsible style which can be folded up at the second hinge, and the lock-unlock system to lock and unlock the hinge is mounted at the second hinge. Accordingly, it is possible to fold up the housing frame at the second hinges which act as fulcrums. As a result, the housing frame can be transported and stored in the smallest space necessary, transportation costs can be reduced, and the space required for storing the housing frames can be saved.

Moreover, by providing the lock-unlock system at a position closer to the collapsing direction than the rotation pin of the second hinge, the lock-unlock system does not become a hindrance when folding up the connecting mechanism. As a result, the housing frame can be folded up more compactly.

If the connecting mechanisms are folded inwardly, the housing frame can be folded up into a small size having essentially the same width as that of the frame boards. If the connecting members are folded outwardly, the housing frame can be folded up to become even thinner. Further, when the connecting members are folded inwardly, the lock-unlock system can be mounted on the second hinge at a position closer to the inside of the housing frame than the rotation pin of the second hinge, thereby greatly reducing the risk of unlocking the lock due to contact with obstacles. In addition, circuit boards and other panel plates can be placed in the housing frame in a more stable environment.

Furthermore, by making the length of the connecting members adjustable in a direction perpendicular to the lengthwise direction of the frame boards, it is possible to correspond to different sizes of circuit boards and other panel plates to be placed inside, and to enhance the usability as the housing frames.

What is claimed is:

1. A collapsible housing frame comprising:

a pair of frame boards opposed to each other; and connecting mechanisms to connect both opposing ends of said frame boards, each of said connecting mechanisms comprising:

first hinges provided on the opposing ends of said frame boards;

connecting members with one end connected to said frame boards via each of said first hinges, wherein a length in a lengthwise direction of each of said connecting members is made adjustable;

a second hinge which connects the other ends of said connecting members to each other to make said connecting mechanisms collapsible; and a lock-unlock system to lock and unlock said second hinge, wherein a plurality of grooves which are parallel to each other with a constant distance in between is formed on the inside surface of each of said frame boards, and housed articles are held in the collapsible housing frame by being supported in said grooves corresponding to a pair of said frame boards.

2. A collapsible housing frame comprising:

a pair of frame boards opposed to each other; and a plurality of connecting mechanisms to connect both opposing ends of said frame boards, each of said connecting mechanisms comprising:

a plurality of first hinges provided on the opposing ends of said frame boards;

a plurality of connecting members with one end connected to said frame boards via each of said first hinges;

a second hinge which connects to other ends of said connecting members to each other to make said connecting mechanisms collapsible; and a lock-unlock system to lock and unlock said second hinge, said lock-unlock system comprising:

an engaging groove formed at said second hinge;

a lock pin with a rib which engages with said engaging groove; and a compression spring adapted to be inserted into said lock pin, wherein as said compression spring extends or contracts, said rib engages with or releases the engagement with said engaging groove, thereby locking or unlocking said second hinge.

3. A collapsible housing frame according to claim 2, wherein a plurality of grooves which are parallel to each other with a constant distance in between are formed on an inside surface of each of said frame boards, where each of said frame board includes corresponding grooves supporting a housed article.

4. A collapsible housing frame according to claim 3, wherein said housed articles are printed circuit boards.

* * * * *